United States Patent
Steuer et al.

(10) Patent No.: US 10,534,026 B2
(45) Date of Patent: Jan. 14, 2020

(54) MULTIPLE PHASE MEASUREMENT DEVICE

(71) Applicant: Fluke Corporation, Everett, WA (US)

(72) Inventors: Ronald Steuer, Hinterbruhl (AT); Peter Radda, Vitis (AT)

(73) Assignee: FLUKE CORPORATION, Everett, WA (US)

( * ) Notice: Subject to any disclaimer, the term of this patent is extended or adjusted under 35 U.S.C. 154(b) by 307 days.

(21) Appl. No.: 15/697,237

(22) Filed: Sep. 6, 2017

(65) Prior Publication Data

US 2019/0072596 A1    Mar. 7, 2019

(51) Int. Cl.
*G01R 25/00* (2006.01)
*G01R 23/02* (2006.01)

(52) U.S. Cl.
CPC .......... *G01R 25/005* (2013.01); *G01R 23/02* (2013.01)

(58) Field of Classification Search
CPC .... G01R 25/005; G01R 21/133; G01R 21/06; G01R 23/02
See application file for complete search history.

(56) References Cited

U.S. PATENT DOCUMENTS

| | | | |
|---|---|---|---|
| 5,473,244 A * | 12/1995 | Libove | G01R 1/22 324/126 |
| 5,995,911 A | 11/1999 | Hart | |
| 9,664,710 B2 | 5/2017 | Roberson | |
| 2003/0184275 A1 * | 10/2003 | Slade | G01R 25/00 324/66 |

(Continued)

FOREIGN PATENT DOCUMENTS

| | | |
|---|---|---|
| AU | 2013206748 A1 | 1/2014 |
| EP | 2 848 947 A1 | 3/2015 |

(Continued)

OTHER PUBLICATIONS

Extended European Search Report, dated Feb. 22, 2019, for European Application No. 18186461.2-1022, 46 pages.

(Continued)

*Primary Examiner* — Daniel R Miller
(74) *Attorney, Agent, or Firm* — Seed Intellectual Property Law Group LLP

(57) ABSTRACT

Systems and methods that measure electrical parameters of a multi-phase electrical system may utilize a multi-phase measurement device that includes a sensor subsystem that has a voltage sensor and a current sensor. Each of the voltage sensor and the current sensor may be a contact-type sensor or a "non-contact" sensor that does not require galvanic contact. In operation, a multi-phase measurement device may utilize the voltage sensor and the current sensor to sequentially obtain single phase measurements for each phase of a multi-phase electrical system. The measurements may be synchronized to obtain various multi-phase power parameters, such as various parameters relating to power, phase, voltage, current, etc. The multi-phase measurement device may be operative to automatically detect when an operator has positioned a sensor of the sensor subsystem proximate a conductor under test so the multi-phase measurement device can initiate detection of one or more electrical parameters in the conductor.

17 Claims, 9 Drawing Sheets

(56) References Cited

U.S. PATENT DOCUMENTS

| | | |
|---|---|---|
| 2006/0247874 A1 | 11/2006 | Premerlani et al. |
| 2010/0237852 A1* | 9/2010 | Tazzari .................. G01R 29/18 324/86 |
| 2014/0239941 A1 | 8/2014 | Coutelou et al. |
| 2016/0292321 A1 | 10/2016 | Wall |

FOREIGN PATENT DOCUMENTS

| | | |
|---|---|---|
| JP | 2002071726 A * | 3/2002 |
| JP | 2009-8580 A | 1/2009 |
| WO | 2016/193213 A1 | 12/2016 |
| WO | 2017/143425 A1 | 8/2017 |

OTHER PUBLICATIONS

Huber et al., "Non-Contact Voltage Measurement Systems," U.S. Appl. No. 62/421,124, filed Nov. 11, 2016, 122 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

* cited by examiner

MULTIPLE PHASE MEASUREMENT DEVICE

BACKGROUND

Technical Field

The present disclosure generally relates to measurement of parameters in multi-phase electrical systems.

Description of the Related Art

Although single-phase electrical systems may be used to supply electricity to domestic and commercial electrical appliances, three-phase alternating current (AC) electrical systems are commonly used to distribute electrical power and to supply electrical power to power equipment rated for relatively high power.

FIG. 1 shows an example three-phase electrical system 10 that includes a three-phase source 12 electrically coupled to a three-phase load 14. In this particular example, the three-phase source 12 includes four conductors, labeled A, B, C, and N, coupled to the three-phase load 14. The conductors A, B, and C each carry AC voltages of identical frequency and similar magnitude, and the conductor N is a common return. The phase of each of the AC voltages in the conductors A, B, and C is separated by 120° from each other. For example, the phase of the voltage in the conductor A may be 0°, the phase of the voltage in the conductor B may be +120°, and the phase of the voltage in the conductor C may be +240°. The three-phase electrical system 10 may be arranged in a delta (Δ) configuration, wye (Y) configuration, etc.

Electrical parameters may be measured in single-phase electrical systems using a wattmeter. Examples of such electrical parameters may include active power, apparent power, volt-amperes reactive power, power factor, harmonics, current, voltage, phase shift, etc. However, measurement of electrical parameters for multi-phase electrical systems is more difficult. As shown in FIG. 1, three voltage measurement channels $V_{CH1}$, $V_{CH2}$, and $V_{CH3}$ and three current measurement channels $A_{CH1}$, $A_{CH2}$, and $A_{CH3}$ are used to measure the electrical parameters of the three-phase electrical system. Each of the voltage/current channel pairs (e.g., $V_{CH1}/A_{CH1}$) may be associated with a separate wattmeter (i.e., three wattmeters total), or all of the channels may be part of a single multi-channel wattmeter.

The setup of such a three-phase measurement may take a significant amount of time and effort for a technician. This is especially the case for electrical systems that are positioned in tight spaces with restricted access, and for electrical systems that have unlabeled conductors. In practice, the technician has to connect four voltage leads, one for each of the conductors A, B, C, and N, to the electrical system, and also has to connect at least three current sensors in series on the correct voltage lines. Thus, a minimum of seven test leads are required to be connected before a measurement can be obtained.

BRIEF SUMMARY

A multi-phase measurement device may be summarized as including a sensor subsystem that, in operation, senses at least one of voltage or current in a conductor; a user interface; control circuitry communicatively coupled to the sensor subsystem, wherein in operation, the control circuitry: causes the user interface to direct a user of the multi-phase measurement device to position a sensor of the sensor subsystem proximate a first conductor of a multi-phase electrical system; receives, via the sensor subsystem, first conductor electrical parameter data associated with a signal present in the first conductor, the first conductor electrical parameter data including at least one of voltage data or current data; processes the received first conductor electrical parameter data to determine a frequency of the signal in the first conductor; establishes synchronization data based at least in part on the determined frequency of the signal in the first conductor; causes the user interface to direct the user to position a sensor of the sensor subsystem proximate a second conductor of the multi-phase electrical system; receives, via the sensor subsystem, second conductor electrical parameter data associated with a signal present in the second conductor, the second conductor electrical parameter data including at least one of voltage data or current data; processes the received second conductor electrical parameter data to determine phase information for the signal in the second conductor relative to phase information for the signal in the first conductor based at least in part on the established synchronization data; causes the user interface to direct the user to position a sensor of the sensor subsystem proximate a third conductor of the multi-phase electrical system; receives, via the sensor subsystem, third conductor electrical parameter data associated with a signal present in the third conductor, the third conductor electrical parameter data including at least one of voltage data or current data; and processes the received third conductor electrical parameter data to determine phase information for the signal in the third conductor relative to phase information for the signal in at least one of the first conductor or the second conductor based at least in part on the established synchronization data.

The synchronization data may include a fixed repeating interval that has a duration that is equal to a period of the signal in the first conductor. The sensor subsystem may include at least a current sensor and a voltage sensor. The sensor subsystem may include at least one of a non-contact voltage sensor or a non-contact current sensor. In operation, the control circuitry may process the first conductor electrical parameter data, second conductor electrical parameter data, and third conductor electrical parameter data to determine at least one additional electrical parameter of the multi-phase electrical system. The at least one additional electrical parameter may include at least one of a voltage parameter, a current parameter, a power parameter, a phase sequence parameter, a voltage phase shift parameter, a current phase shift parameter, a voltage/current phase shift parameter, a harmonics parameter, or a waveform parameter. In operation, the control circuitry may cause the user interface to present an indication of the determined phase information on a display of the user interface. The indication of the determined phase information may include a phasor diagram presented on the display of the user interface. Prior to the reception of each of the first conductor electrical parameter data, second conductor electrical parameter data, and third conductor electrical parameter data, the control circuitry may receive measurement data from the sensor subsystem indicative of whether the sensor of the sensor subsystem is positioned proximate the first conductor, second conductor, and third conductor, respectively. The sensor subsystem may generate a reference current, and the measurement data may include a characteristic of the reference current detected in the first conductor, second conductor, or third conductor.

Responsive to receipt of measurement data indicative that the sensor of the sensor subsystem is not positioned proximate one of the first conductor, second conductor, or third conductor after a time period, the control circuitry may cause the user interface to direct the user to restart measurement of the multi-phase electrical system. In operation, the control circuitry may process the received first conductor electrical parameter data utilizing a Fast Fourier Transform (FFT) to determine a frequency of the signal in the first conductor. A time period between when the control circuitry causes the user interface to direct the user to position the sensor of the sensor subsystem proximate the first conductor and when the control circuitry receives third conductor electrical parameter data associated with the signal present in the third conductor may be constrained to be less than 30 seconds.

A multi-phase measurement device may be summarized as including a sensor subsystem that, in operation, senses at least one of voltage or current in a conductor; a user interface; control circuitry communicatively coupled to the sensor subsystem, wherein in operation, the control circuitry: causes the user interface to direct a user of the multi-phase measurement device to position a sensor of the sensor subsystem proximate a first conductor of a multi-phase electrical system; receives, via the sensor subsystem, first conductor electrical parameter data associated with a signal present in the first conductor, the first conductor electrical parameter data including at least one of voltage data or current data; processes the received first conductor electrical parameter data to determine a frequency of the signal in the first conductor; establishes synchronization data based at least in part on the determined frequency of the signal in the first conductor; causes the user interface to direct the user to position a sensor of the sensor subsystem proximate a second conductor of the multi-phase electrical system; receives, via the sensor subsystem, second conductor electrical parameter data associated with a signal present in the second conductor, the second conductor electrical parameter data including at least one of voltage data or current data; and processes the received second conductor electrical parameter data to determine phase information for the signal in the second conductor relative to phase information for the signal in the first conductor based at least in part on the established synchronization data.

A method of operating a multi-phase measurement device may be summarized as including causing, by control circuitry, a user interface to direct a user to position a sensor of a sensor subsystem proximate a first conductor of a multi-phase electrical system; receiving, by the control circuitry via the sensor subsystem, first conductor electrical parameter data associated with a signal present in the first conductor, the first conductor electrical parameter data including at least one of voltage data or current data; processing, by the control circuitry, the received first conductor electrical parameter data to determine a frequency of the signal in the first conductor; establishing, by the control circuitry, synchronization data based at least in part on the determined frequency of the signal in the first conductor; causing, by the control circuitry, the user interface to direct the user to position a sensor of the sensor subsystem proximate a second conductor of the multi-phase electrical system; receiving, by the control circuitry via the sensor subsystem, second conductor electrical parameter data associated with a signal present in the second conductor, the second conductor electrical parameter data including at least one of voltage data or current data; processing, by the control circuitry, the received second conductor electrical parameter data to determine phase information for the signal in the second conductor relative to phase information for the signal in the first conductor based at least in part on the established synchronization data; causing, by the control circuitry, the user interface to direct the user to position a sensor of the sensor subsystem proximate a third conductor of the multi-phase electrical system; receiving, by the control circuitry via the sensor subsystem, third conductor electrical parameter data associated with a signal present in the third conductor, the third conductor electrical parameter data including at least one of voltage data or current data; and processing, by the control circuitry, the received third conductor electrical parameter data to determine phase information for the signal in the third conductor relative to phase information for the signal in at least one of the first conductor or the second conductor based at least in part on the established synchronization data.

The method may further include processing, by the control circuitry, the first conductor electrical parameter data, second conductor electrical parameter data, and third conductor electrical parameter data to determine at least one additional electrical parameter of the multi-phase electrical system.

The method may further include processing, by the control circuitry, the first conductor electrical parameter data, second conductor electrical parameter data, and third conductor electrical parameter data to determine at least one of a voltage parameter, a current parameter, a power parameter, a phase sequence parameter, a voltage phase shift parameter, a current phase shift parameter, a voltage/current phase shift parameter, a harmonics parameter, or a waveform parameter.

The method may further include causing, by the control circuitry, the user interface to present an indication of the determined phase information on a display of the user interface.

The method may further include prior to receiving each of the first conductor electrical parameter data, second conductor electrical parameter data, and third conductor electrical parameter data, receiving, by the control circuitry, measurement data from the sensor subsystem indicative of whether the sensor of the sensor subsystem is positioned proximate the first conductor, second conductor, and third conductor, respectively.

The method may further include responsive to receiving measurement data indicative that the sensor of the sensor subsystem is not positioned proximate one of the first conductor, second conductor, or third conductor after a time period, causing, by the control circuitry, the user interface to direct the user to restart measurement of the multi-phase electrical system. Processing the received first conductor electrical parameter data, second conductor electrical parameter data, and third conductor electrical parameter data may include processing the received first conductor electrical parameter data, second conductor electrical parameter data, and third conductor electrical parameter data utilizing a Fast Fourier Transform (FFT).

A multi-phase measurement device may be summarized as including a sensor subsystem that, in operation, senses voltage and current in a conductor; a user interface; control circuitry communicatively coupled to the sensor subsystem, wherein in operation, the control circuitry: causes the sensor subsystem to sequentially obtain at least three single phase measurements, each of the single phase measurements providing single phase electrical parameter data for a single phase of a multi-phase electrical system; and determines multi-phase electrical system parameters for the multi-phase electrical system based on the single phase electrical parameter data provided by the sequentially obtained single phase measurements.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
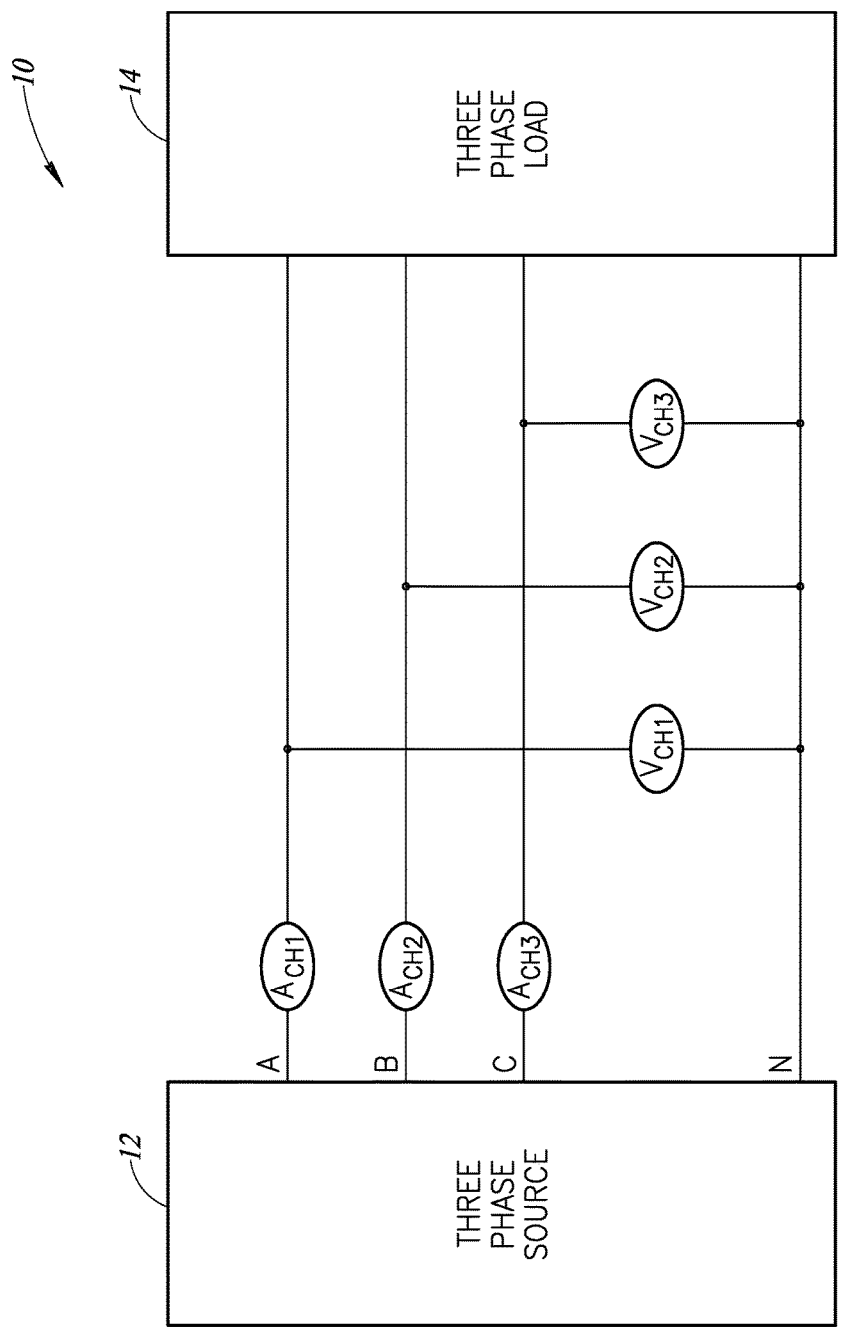
FIG. 1 is a schematic block diagram of a three-phase electrical system that includes a three phase source coupled to a three phase load, showing measurement of electrical parameters using a plurality of voltage measurement channels and current measurement channels of a multi-channel wattmeter.

One or more implementations of the present disclosure are directed to systems and methods for measuring electrical parameters of a multi-phase electrical system utilizing a multi-phase measurement device that includes a sensor subsystem that has a single voltage sensor and a single current sensor. That is, the hardware of the multi-phase measurement device may be similar or identical to a wattmeter that has a single voltage measurement channel and a single current measurement channel. Each of the voltage sensor and the current sensor may be a contact-type sensor or a non-contact sensor. In various implementations of the present disclosure, multi-phase measurement is accomplished by sequentially obtaining single phase measurements for each phase of a multi-phase electrical system, and synchronizing the measurements to obtain various multi-phase electrical parameters. Such multi-phase electrical parameters include, but are not limited to, phase relationships between conductors (e.g., phase sequence), phase shifts between voltage and current in a conductor, active power, active fundamental power, reactive power, reactive fundamental power, apparent system power, apparent system fundamental power, power factor, displacement power factor, etc. Various implementations of the present disclosure are discussed below with reference to FIGS. 2-9.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

Moreover, the headings and Abstract of the Disclosure provided herein are for convenience only and do not interpret the scope or meaning of the implementations.

Figure 2:
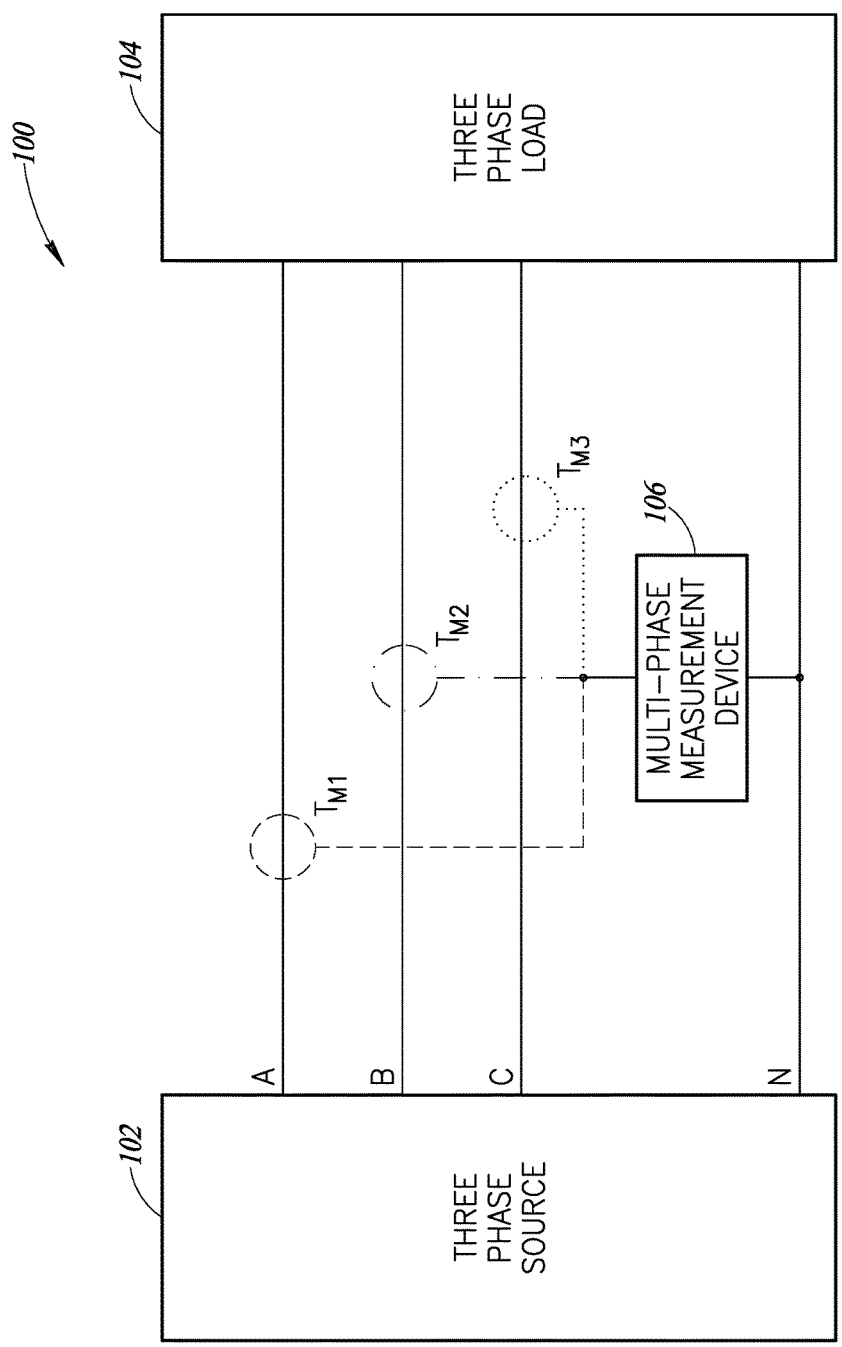
FIG. 2 is a schematic block diagram of a three-phase electrical system including a three phase source coupled to a three phase load, showing measurement of electrical parameters using a multi-phase measurement device according to one illustrated implementation.

FIG. 2 shows a schematic block diagram of an example three-phase electrical system 100 that includes a three-phase source 102 electrically coupled to a three-phase load 104. In this example, the three-phase source 102 includes four conductors, labeled A, B, C, and N, coupled to the three-phase load 104. The conductors A, B, and C each carry AC voltages of identical frequency and similar magnitude, and the conductor N is a common return. The phase of each of the AC voltages in the conductors A, B, and C is separated by 120° from each other. For example, the phase of the voltage in the conductor A may be 0°, the phase of the voltage in the conductor B may be +120°, and the phase of the voltage in the conductor C may be +240° (or equivalently, −120°). The three-phase electrical system 100 may be arranged in a delta (Δ) configuration, wye (Y) configuration, etc.

Figure 3:
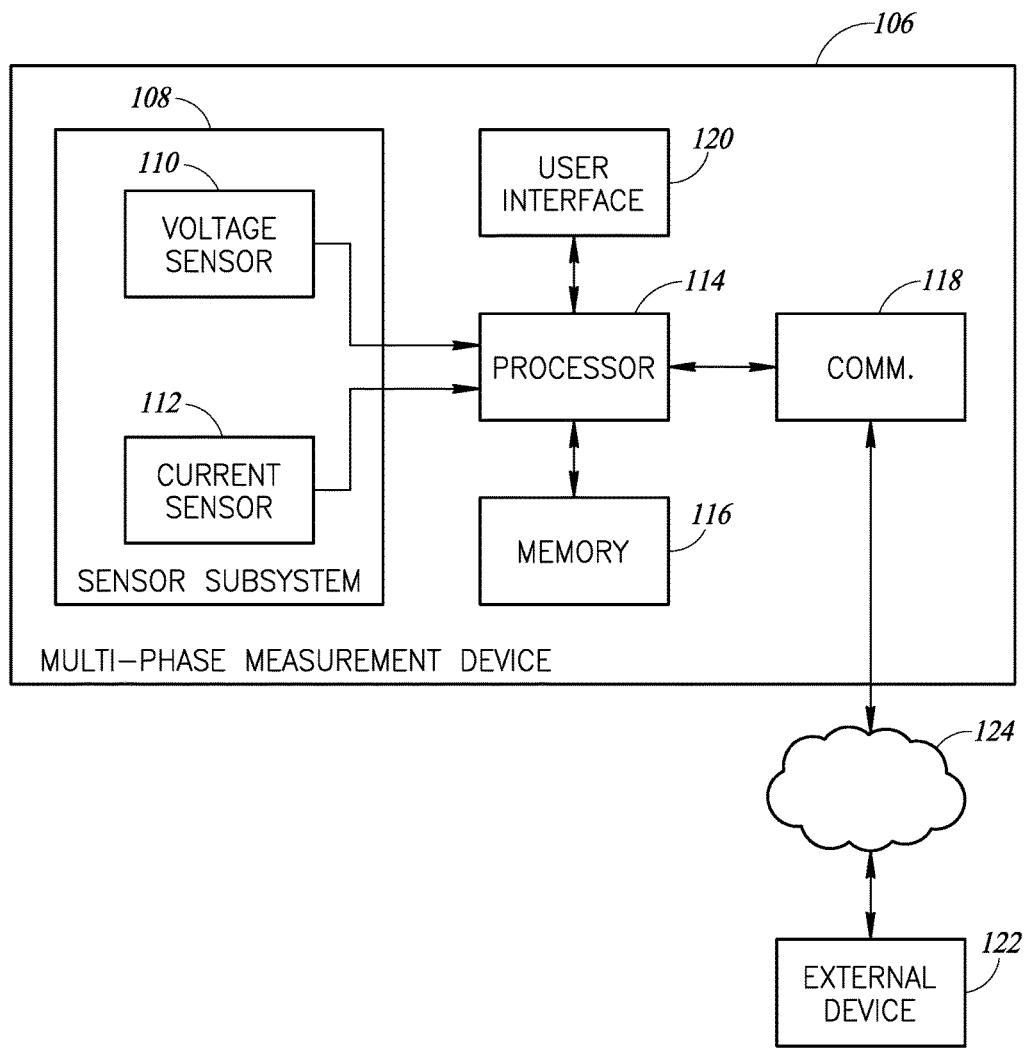
FIG. 3 is a schematic block diagram of the multi-phase measurement device shown in FIG. 2, according to one illustrated implementation.

Also shown in FIG. 2 is a multi-phase measurement device 106. Various components of the multi-phase measurement device 106 are shown in FIG. 3 and discussed below. The multi-phase measurement device 106 includes a sensor subsystem 108 (FIG. 3) that includes a voltage sensor 110 and a current sensor 112. The voltage sensor 110 is operative to sense voltage in a conductor, and the current sensor 112 is operative to sense current in a conductor. The voltage sensor 110 and/or the current sensor 112 may be non-contact sensors or contact sensors, as discussed further below.

Generally, in operation, an operator of the multi-phase measurement device 106 may first position the sensor subsystem 108 of the multi-phase measurement device proximate a first one of the four conductors, such as the conductor A, at a first measurement time period $T_{M1}$. The multi-phase measurement device 106 may then measure one or more electrical parameters of a signal in the conductor A via the sensor subsystem. The measured electrical parameter may include the frequency of the signal in the conductor A. The frequency may be the frequency of a voltage in the conductor, the frequency of a current in the conductor, or both.

Once the multi-phase measurement device 106 has identified the conductor by exceeding a voltage limit and achieved a steady state for reliable stable values, e.g., by averaging multiple values to measure the one or more electrical parameters of the signal in the conductor A, a user interface of the multi-phase measurement device 106 may direct the operator to move the sensor subsystem 108 of the multi-phase measurement device 106 proximate a second one of the conductors, such as the conductor B, at a second measurement time $T_{M2}$. The multi-phase measurement device 106 may then measure one or more electrical parameters of a signal in the conductor B via the sensor subsystem 108. For example, the phase shift of the signal in the conductor B may be determined relative to the determined frequency of the signal in the conductor A.

Once the multi-phase measurement device 106 has measured the one or more electrical parameters of the signal in the conductor B, the user interface may direct the operator to move the sensor subsystem 108 of the multi-phase measurement device 106 proximate a third one of the conductors, such as the conductor C, at a third measurement time $T_{M3}$. The multi-phase measurement device 106 may then measure one or more electrical parameters of a signal in the conductor C via the sensor subsystem 108. The phase shift of the signal in the conductor C may be determined relative to the determined frequency of the signal in the conductor A, and/or the determined frequency of the signal in the conductor B obtained during measurement thereof. Once the multi-phase measurement device 106 has measured the one or more electrical parameters of the signal in the conductor C, all single phase values are available to the multi-phase measurement device, which may determine and calculate various electrical parameters for the whole multi-phase system (e.g., power parameters, current parameters, voltage parameters, phase parameters and system parameters like system power, phase rotation, and unbalance) of the three-phase electrical system 100 and may present such to the operator via a user interface or may send data related to such via a wired or wireless communications interface of the multi-phase measurement device.

FIG. 3 is a schematic block diagram of the multi-phase measurement device 106, also referred to as an instrument, system, tool, or apparatus. The measurement device 106 may be operative to determine one or more single-phase and multi-phase AC electrical parameters (e.g., voltage, current, power, phase, energy, frequency, harmonics) of an electrical system obtained from contact or non-contact current or voltage measurements or derived from such measurements. For example, an operator may be able to select various modes of operation, such as single-phase voltage, single-phase current, single-phase power, three-phase voltage, three-phase current, three-phase power, etc. The measurement device 106 may be a handheld device or system generally configured to be held in a user's hand while taking a measurement. However, it should be appreciated that the measurement device 106 need not always be held in a user's hand and may be positioned by a user to not be held, for example, by affixing or hanging the device from a support or from a machine. In other implementations, the measurement device 106 may be designed to be removably or permanently positioned at a particular location to monitor and measure one or more electrical circuits.

The measurement device 106 includes a processor 114, nontransitory processor-readable storage medium or memory 116, the voltage measurement sensor or tool 110, the current measurement sensor or tool 112, a communications subsystem or interface 118, and a user interface 120. In at least some implementations, the measurement device 106 may not include each of the aforementioned components or may include additional components not depicted in FIG. 3. The various components of the measurement device 106 may be powered by at least one removable or non-removable battery, by electrical mains, by an inductive power system, by a thermal energy conversion system, etc. Further, the various components of the measurement device 106 may be disposed in or on a single housing, or may be distributed across multiple physical devices or tools that are communicatively coupled together via wired and/or wireless communication channels. In at least some implementations, the measurement device 106 has no exposed conductive components, which eliminates the possibility of the measurement device 106 making galvanic contact with an electrical conductor or circuit.

The processor 114 may serve as the computational center of the measurement device 106 by supporting the execution of instructions. The processor 114 may include one or more logic processing units, such as one or more central processing units (CPUs), microprocessors, digital signal processors (DSPs), application-specific integrated circuits (ASICs), field programmable gate arrays (FPGAs), digital circuitry, analog circuitry, combinations of digital and analog circuitry, etc. The memory 116 may include one or more forms of nontransitory processor-readable storage media, which may include any currently available or later developed storage media suitable for storing programs or data that is accessible by one or more device components, such as the processor 114. The memory 116 may be removable or non-removable and may be volatile or non-volatile. Non-limiting examples of memory include hard drives, optical drives, RAM, ROM, EEPROM, and flash types of memory. The memory 116 may be integrated with the processor 114 or separate therefrom. For example, the processor 114 may include a microcontroller, such as an ARM-based microcontroller, that includes memory 116 and one or more programmable input/output peripherals. The processor 114 and memory 116 may be generally referred to herein as "control circuitry." The communications interface or subsystem 118 may include one or more components for communicating with an external device 122 over one or more wired or wireless communications networks 124 (e.g., Internet). The external device 122 may be a mobile phone, tablet computer, personal computer (PC), cloud-based server, etc. Non-limiting examples of wireless communications technologies include Wi-Fi®, Bluetooth®, Bluetooth® Low Energy, Zigbee®, 6LoWPAN®, Optical IR, wireless HART, etc. Non-limiting examples of wired communications technologies include USB®, Ethernet, PLC, HART, MODBUS, FireWire®, Thunderbolt®, etc. Further, in addition to sending data to the external device 122, in at least some implementations the measurement device 106 may receive at least one of data or instructions (e.g., control instructions) from the external device 122 via the one or more wired or wireless communications networks 124.

The user interface 120 may include one or more input devices and a display subsystem, for example. Generally, the user interface 120 may include any device that allows a user or an external system to interact with the processor 114 and any device that allows the processor 114 to display or otherwise present information. In at least one implementation, the user interface 120 allows a user to control or configure the measurement device 106 to perform a particular measurement or to request particular data from the measurement device. As discussed in more detail below, information regarding the particular configuration of the mobile measurement device 106 may be stored in the memory 116. A display subsystem of the user interface 120 may be, for example, a liquid crystal display (LCD) device, light emitting diode (LED) display, etc. In at least some implementations, the display subsystem may be capable of displaying color images. In at least some implementations, the display subsystem of the user interface 120 may include a touchscreen which allows for user input. In response to an input by a user to the user interface 120, the display subsystem may display information or data related to a specific measurement. As discussed in further detail below, the display subsystem of the user interface 120 may display one or more images that depict a phasor diagram for multiple phases of a multi-phase electrical system. More generally, the display subsystem of the user interface may display one or more signal characteristics or parameters, such as voltage, current, frequency, power parameters (e.g., watts, KVA), phase sequence, phase shift, energy, harmonics, etc.

The user interface 120 may include a single input device or a combination of input devices configured to communicate an input to the processor 114 of the measurement device 106. Non-limiting examples of input devices include buttons, a keypad, a touchpad, switches, selectors, a rotary switch, or other known or later developed input devices. As mentioned above, the user interface 120 may include an input device that is incorporated into a display subsystem as a touchscreen. In at least some implementations, the measurement device 106 operates to perform a particular type of measurement in response to a user input or selection that is input to an input device of the user interface 120. The particular measurement configuration may be configurable by modifying measurement setting data, for example. In at least some implementations, setting data may be associated with particular measurement data and stored in the memory 116. In one example, if a user presses a particular button of an input device of the user interface 120, actuation of the button may configure the type of measurement (e.g., single phase measurement, multi-phase measurement) performed by the measurement device 106.

The voltage sensor 110 and/or current sensor 112 may be contact-type voltage sensors that receive input via a galvanic connection between a conductor under test and a test electrode or probe. In at least some implementations, at least one of the voltage sensor 110 and the current sensor 112 may be a "non-contact" voltage sensor tool or a "non-contact" current sensor tool, respectively, that is able to obtain a measurement without requiring a galvanic connection between a conductor under test and a test electrode or probe. Thus, it should be understood that the term "non-contact" refers to galvanic contact rather than physical contact. Non-limiting examples of types of non-contact current sensors include fluxgate sensors, Hall Effect sensors, Rogowski coils, current transformers, giant magnetoresistance (GMR) magnetic sensors, etc. Non-limiting examples of types of non-contact voltage sensors include "capacitive divider" type voltage sensors, "reference signal" type voltage sensors, "multi-capacitor" type voltage sensors, etc.

Generally, capacitive divider type voltage sensors or systems measure AC voltage of an insulated conductor (e.g., insulated wire) without requiring a galvanic connection between the conductor and a test electrode or probe. A capacitive divider type voltage sensor may include a variable capacitance tool that operates to generate a variable capacitive voltage between an insulated conductor under test and earth ground or other reference. During measurement, the non-contact voltage measurement device varies the capacitance of the variable capacitance tool to change the impedance of a capacitive divider circuit between the insulated conductor under test and earth ground. By sequentially making two (or three) measurements across the variable capacitance tool, the AC voltage of the insulated conductor can be determined without requiring any galvanic connection to the insulated conductor.

Generally, a "reference signal" type voltage sensor may be a non-contact voltage sensor that includes a conductive sensor, an internal ground guard and a reference shield. A common mode reference voltage source may be electrically coupled between the internal ground guard and the reference shield to generate an AC reference voltage which causes a reference current to pass through the conductive sensor. At least one processor may receive a signal indicative of current flowing through the conductive sensor due to the AC reference voltage and the AC voltage in the insulated conductor, and determines the AC voltage in the insulated conductor based at least in part on the received signal. Reference signal type voltage sensors are discussed in further detail below with reference to FIGS. 7A, 7B, 8 and 9.

Generally, a "multi-capacitor" type voltage sensor may include a plurality of conductive sensors which capacitively couple with an insulated conductor. Each of the plurality of sensors may differ from the other of the conductive sensors with respect to at least one characteristic which affects capacitive coupling. At least one processor receives signals indicative of the voltages at the conductive sensors due to the AC voltage in the insulated conductor, and determines the AC voltage in the insulated conductor based at least in part on the received signals.

Various non-limiting examples of such non-contact sensors are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

In operation, the processor 114 receives signals from the voltage sensor 110 and the current sensor 112 to obtain voltage and current measurements, respectively. The processor 114 may utilize such voltage and current measurements to derive additional AC electrical parameters based on the combination of the measurements. Such parameters may include, for example, power (e.g., active power, apparent power, reactive power), phase relationships, frequency, harmonics, energy, etc. The voltage and current sensor signals may be obtained by the respective voltage and current sensors 110 and 112 during a common measurement time interval, which may be relatively short in duration (e.g., 10 milliseconds (ms), 100 ms, 1 second, 5 seconds, 10 seconds). For example, the voltage sensor 110 and the current sensor 112 may obtain measurements at least partially concurrent with each other. As another example, one of the voltage sensor 110 and the current sensor 112 may obtain a measurement substantially immediately after the other of the voltage sensor and the current sensor obtains a measurement, such that the measurements are obtained at nearly the same time. In some implementations, the voltage sensor 110 and the current sensor 112 may be operative to repeatedly obtain measurements, concurrently or in succession, at specified intervals (e.g., every 10 ms, every 100 ms, every 1 second, every 10 seconds). Generally, for a particular conductor under test, the voltage sensor 110 and the current sensor 112 both obtain their respective measurements within a measurement time interval that is sufficiently short such that pairs of the voltage and current measurements correspond to each other, which allows for accurate derivation or determination of one or more AC electrical parameters (e.g., power, phase) using the obtained current and voltage measurements.

Figure 4:
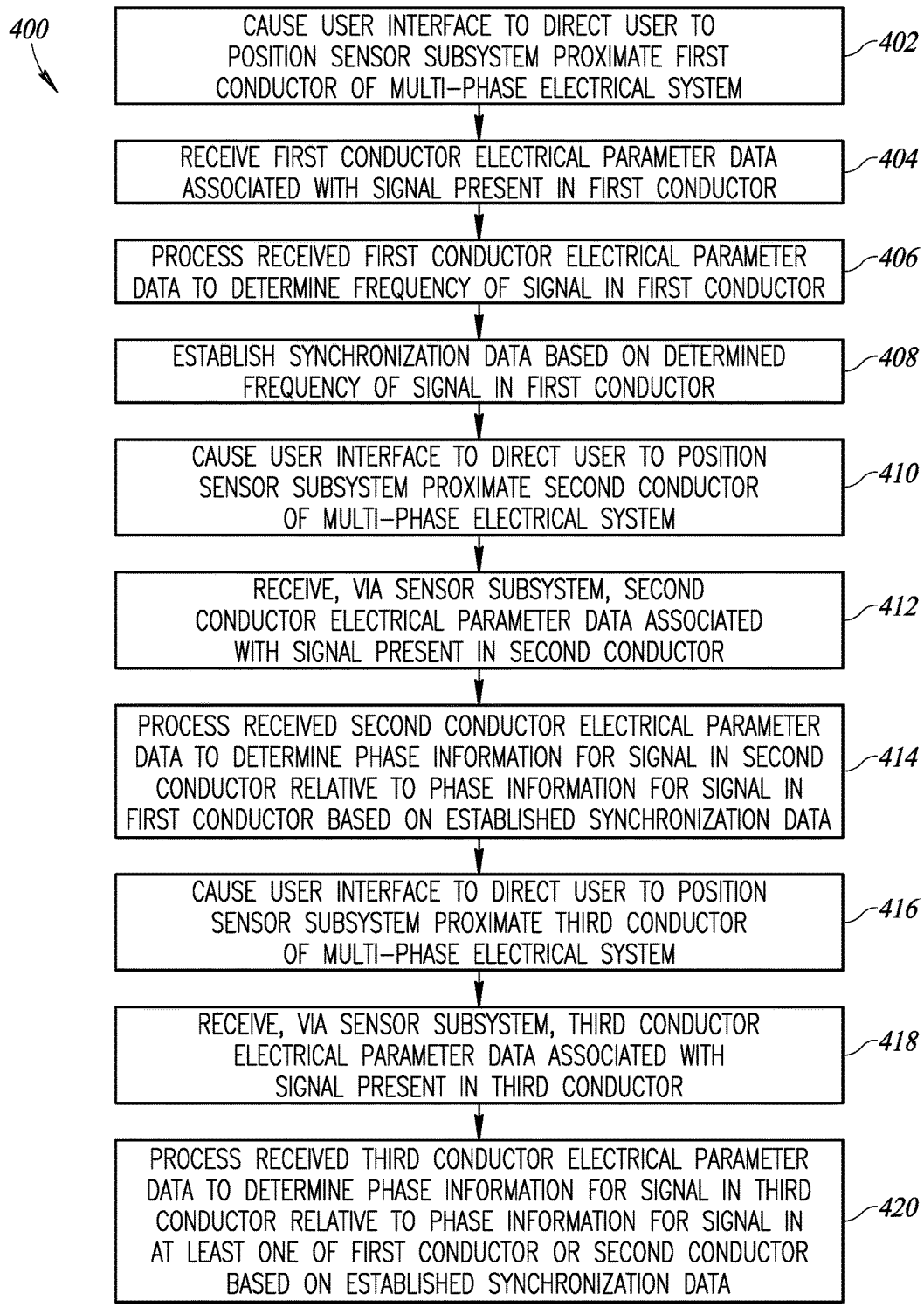
FIG. 4 is a flow diagram for a method of operating a multi-phase measurement device to measure one or more parameters of a multi-phase electrical system, according to one illustrated implementation.
Figure 5:
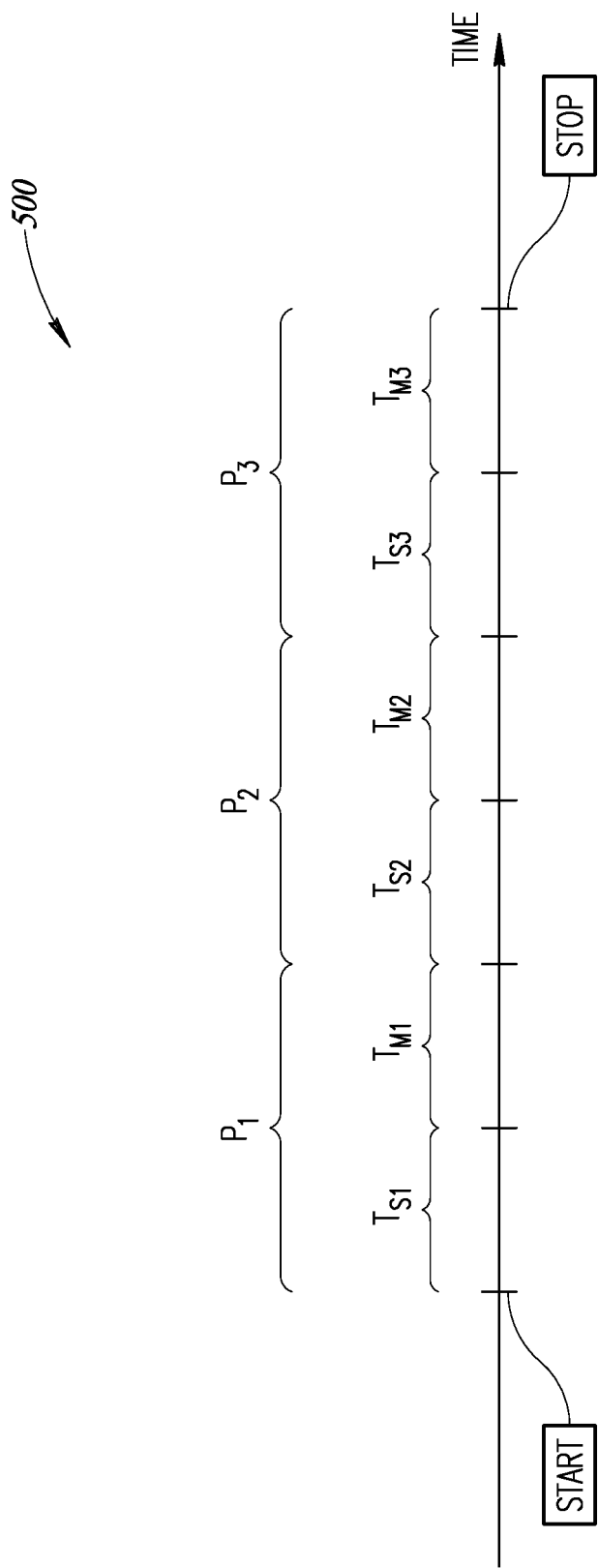
FIG. 5 is a timeline that illustrates various stages of a method of operating a multi-phase measurement device to measure one or more electrical parameters of a multi-phase electrical system, according to one illustrated implementation.

FIG. 4 shows a method 400 of operating a multi-phase measurement device, such as the multi-phase measurement device 106, to measure one or more electrical parameters of a three-phase electrical system (e.g., the three-phase electrical system 100 of FIG. 2). FIG. 5 shows an example timeline 500 for obtaining electrical parameter measurements for a three-phase electrical system. Generally, the multi-phase measurement device is used to sequentially obtain measurements on each of the different conductors of a multi-phase electrical system, and synchronize the measurements with respect to one of the measurements, e.g., the first measurement. As shown in FIG. 5, the measurement process for a three-phase electrical system may be divided into three phases $P_1$, $P_2$ and $P_3$, one for each of a first conductor, second conductor, and third conductor, respectively, of the three-phase electrical system. The first phase $P_1$ may include a sensing phase $T_{S1}$ followed by a measurement phase $T_{M1}$. Similarly, the second phase $P_2$ may include a sensing phase $T_{S2}$ followed by a measurement phase $T_{M2}$, and the third phase $P_3$ may include a sensing phase $T_{S3}$ followed by a measurement phase $T_{M3}$. The duration of the various phases may be constrained to ensure accurate measurements, as discussed further below.

At 402, the control circuitry of the multi-phase measurement device may cause the user interface of the multi-phase measurement device to direct an operator to position the sensor subsystem proximate the first conductor of a multi-phase electrical system. For example, the control circuitry may cause the user interface to display a message (e.g., "start measurement" or "measure first phase"). This may occur in response to the operator initiating the multi-phase measurement via an input (e.g., button) of the user interface that instructs the control circuitry to "start" the measurement.

As shown in the timeline 500 of FIG. 5, in at least some implementations, upon initiating the measurement, during the first sensing phase $T_{S1}$ the control circuitry may receive measurement data from the sensor subsystem (e.g., voltage sensor, current sensor) indicative of whether the sensor subsystem is positioned proximate the first conductor. This feature enables the control circuitry to ensure that the sensor subsystem is properly positioned before measurements are obtained. For example, as discussed further below with reference to FIGS. 7A, 7B, 8, and 9, in at least some implementations the sensor subsystem generates a reference current, and the measurement data includes a characteristic (e.g., magnitude) of the reference current detected in the first conductor. The characteristic of the reference current may be compared to a threshold to determine that the sensor subsystem is positioned proximate the first conductor. As another example, the control circuitry may first detect that a sensed voltage or current is above a determined threshold before triggering the actual measurement. Such feature allows the multi-phase measurement device to begin obtaining measurements as soon as the system detects that the sensor subsystem is correctly positioned for the non-contact method or that the test probe is in contact with the device under test.

In at least some implementations, responsive to receipt of measurement data indicative that the sensor subsystem is not positioned proximate the first conductor after a time period (e.g., 5 seconds), the control circuitry may cause the user interface to direct the user to restart measurement of the multi-phase electrical system. In other implementations, the user may manually notify the multi-phase measurement device via an input (e.g., button, microphone) that the sensor system is in position to obtain a measurement. In such implementations, the control circuitry may cause the user interface to direct the user to restart measurement of the multi-phase electrical system if the user does not indicate that the sensor subsystem is correctly positioned within a specified time period (e.g., 5 seconds, 10 seconds).

At 404, the control circuitry may receive, via the sensor subsystem, first conductor electrical parameter data associated with a signal present in the first conductor. The first conductor electrical parameter data may include at least one of voltage data or current data. In at least some implementations, this first measurement phase $T_{M1}$ occurs responsive to the receipt of measurement data indicative that the sensor subsystem is properly positioned proximate the first conductor during the first sensing phase $T_{S1}$. In some implementations, the first measurement phase $T_{M1}$ automatically begins immediately after the control circuitry detects that the sensor subsystem is properly positioned.

At 406, the control circuitry processes the received first conductor electrical parameter data to determine a frequency of the signal in the first conductor. For example, the control circuitry may obtain a number (e.g., 50) of measurements that each include a number (e.g., 1024) of data points that can be processed by a Fast Fourier Transform (FFT) algorithm. The control circuitry may average the results of the FFT to obtain frequency, magnitude and phase information for the signal in the first conductor. In at least some implementations, zero-crossing detection may be used in addition to or instead of an FFT to determine phase information. The control circuitry may also determine or record one or more other parameters, such as voltage, current, phase shift, time stamps, harmonics, waveforms, etc., of the signal in the first conductor.

At 408, the control circuitry may establish synchronization data based at least in part on the determined frequency of the signal in the first conductor. For example, the control circuitry may establish a fixed repeating interval to the measured cycle time (or period) as a zero phase reference to be used for subsequent measurements. For instance, if the signal in the first conductor is determined to have a frequency of 50 Hz, the synchronization interval may be set to be 20 ms, which is equal to the cycle time or period of the 50 Hz signal. Similarly, if the signal in the first conductor is determined to have a frequency of 60 Hz, the synchronization interval may be set to be 16.67 ms, which is equal to the period of the 60 Hz signal. In at least some implementations, the control circuitry may first obtain all measurement data for each the multiple phases of a multi-phase electrical system, and then may establish the synchronization data by processing or analyzing at least some of the received measurement data.

At 410, after the control circuitry has obtained the measurements for the first conductor, the control circuitry may cause the user interface to direct the user to position the sensor subsystem proximate the second conductor of the multi-phase electrical system during the second sensing phase $T_{S2}$. During the second sensing phase $T_{S2}$, the control circuitry may detect whether the sensor subsystem is positioned proximate the second conductor.

At 412, the control circuitry may receive, via the sensor subsystem, second conductor electrical parameter data associated with a signal present in the second conductor during the second measurement phase $T_{M2}$. As discussed above, this act may occur responsive to the control circuitry detecting that the sensor subsystem is positioned proximate the second conductor during the sensing phase $T_R$. Alternatively, if the control circuitry detects that the sensor subsystem is not positioned proximate the second conductor within the time period for the second sensing phase $T_{S2}$ (e.g., 5 seconds), the control circuitry may cause the user interface to instruct the user to restart the three-phase measurement process because too much time has elapsed between measurements.

At 414, the control circuitry may process the received second conductor electrical parameter data to determine phase information for the signal in the second conductor relative to phase information for the signal in the first conductor based at least in part on the established synchronization data.

Figure 6:
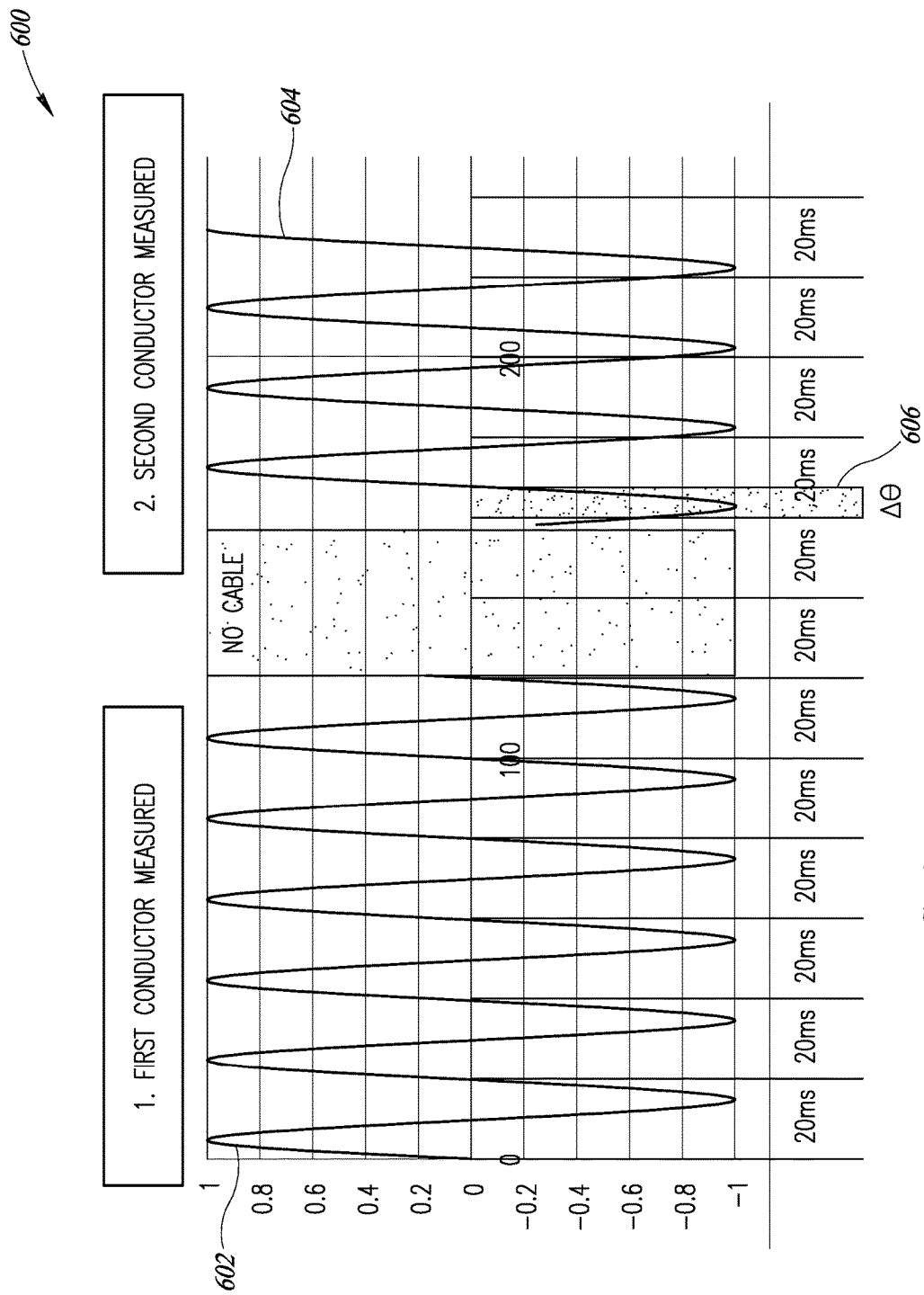
FIG. 6 is a graph showing example waveforms captured during a measurement of a first conductor and a second conductor of a multi-phase electrical system, the graph illustrating frequency detection of a signal in the first conductor which is subsequently used to establish synchronization data that is used to detect the phase of a signal in the second conductor relative to the phase of the signal in the first conductor, according to one illustrated implementation.

FIG. 6 shows a graph 600 which illustrates an example of this feature. As shown, a signal 602 in the first conductor was determined to have a frequency of 50 Hz, so the control circuitry established a fixed repeating interval of 20 ms, the period of the 50 Hz signal, which is synchronized to the signal in the first conductor. Then, after the operator has moved the sensor subsystem to the second conductor, a signal 604 in the second conductor is measured with reference to the fixed repeating interval synchronized to the signal 602 in the first conductor, as indicated by the highlighted portion 606 that shows the phase shift ($\Delta\theta$) between the signal in the second conductor relative to the signal in the first conductor. Thus, when the signal 604 in the second conductor is processed using an FFT, the phase information output by the FFT is indicative of the relative phase between the signal 604 in the second conductor and the signal 602 in the first conductor.

At 416, after obtaining measurement data for the second conductor, the control circuitry may cause the user interface to direct the user to position the sensor subsystem proximate a third conductor of the multi-phase electrical system. As discussed above, the control circuitry may detect whether the sensor subsystem is positioned proximate the third conductor during the third sensing phase $T_{s3}$.

At 418, the control circuitry may receive, via the sensor subsystem, third conductor electrical parameter data associated with a signal present in the third conductor. At 420, the control circuitry may process the received third conductor electrical parameter data to determine phase information for the signal in the third conductor relative to phase information for the signal in at least one of the first conductor or the second conductor based at least in part on the established synchronization data, as discussed above. As noted above, in at least some implementations, the control circuitry may first obtain all measurement data for each the multiple phases of a multi-phase electrical system, and then may establish the synchronization data by processing or analyzing at least some of the received measurement data.

Once the measurement data has been processed, the control circuitry may present the multi-phase parameters to the user via the user interface, or may send the parameters to an external device via a wired or wireless communications channel. For instance, as shown in FIG. 7B, the control circuitry may cause a display of the multi-phase measurement device to display a phasor diagram 701 for the measured signals of the multi-phase electrical system. Electrical parameters that may be determined and presented include, but are not limited to, voltage parameters, current parameters, power parameters, phase sequence parameters, voltage phase shift parameters, current phase shift parameters, voltage/current phase shift parameters, harmonics parameters, waveform parameters, etc.

The frequency of the signals in the conductors of a multi-phase system may vary over time. Accordingly, in at least some implementations, the total duration of the measurement process (e.g., phases $P_1$, $P_2$ and $P_3$) may be constrained to a relatively short period of time (e.g., 30 seconds). For example, in at least some implementations, the duration of each of the measurement intervals $T_{S1}$, $T_{M2}$, and $T_{M3}$ is 5 seconds, and the maximum duration of each of the sensing intervals $T_{S1}$, $T_{S2}$, and $T_{s3}$ is 5 seconds, which constrains the total duration of the measurement period to 30 seconds.

Additionally, it is important to obtain an accurate frequency measurement for the signal in the first conductor so that the measurements for the signals in the second and subsequent conductors can be accurately synchronized to the signal in the first conductor. For example, for a 50 Hz signal, the cycle time is 20 ms, and a 1° phase shift corresponds to 55.5 µs. Thus, if the frequency measurement is performed with 0.1% accuracy, the uncertainty is 20 µs, or a 0.36° phase shift. This results in an uncertainty of 18° per second, and after 10 seconds the uncertainty would be 180°, which is unusable. Thus, in at least some implementations, the uncertainty of the determined frequency should be better than 0.1% (e.g., 0.01%), so the first signal may be artificially extended or interpolated to synchronize the second and subsequent frequency measurements with accuracy. As discussed above, in at least some implementations, a number (e.g., 10, 50, 100) of samples may be obtained during the measurement period (e.g., $T_{M1}$, $T_{M2}$, $T_{M3}$), and those samples may be averaged to determine an accurate frequency measurement. For example, the control circuitry may obtain 50 samples that each include 1024 FFT points obtained within a 100 ms interval, for a total measurement time of 5 seconds (i.e., 50 samples×100 ms/sample) for each measurement period $T_{M1}$, $T_{M2}$, or $T_{M3}$.

Reference Signal Type Non-Contact Multi-Phase Measurement Devices

The following discussion provides examples of systems and methods for measuring alternating current (AC) voltage of an insulated or blank uninsulated conductor (e.g., insulated wire) without requiring a galvanic connection between the conductor and a test electrode or probe. The implementations disclosed in this section may be referred to herein as "reference signal type voltage sensors" or systems. Generally, a non-galvanic contact (or "non-contact") measurement device is provided which measures an AC voltage signal in an insulated conductor with respect to ground using a capacitive sensor. As discussed above, the "reference signal" systems and methods discussed below may also be used during the sensing phases $T_{S1}$, $T_{S2}$, and $T_3$ to detect whether the sensor subsystem (e.g., sensor subsystem 108 of FIG. 3) is positioned proximate a conductor under test. Such feature may be advantageous for a number of reasons, including enabling automatic initiation of measurements substantially immediately after it is determined that the sensor subsystem in properly positioned with respect to the conductor under test.

Figure 7A:
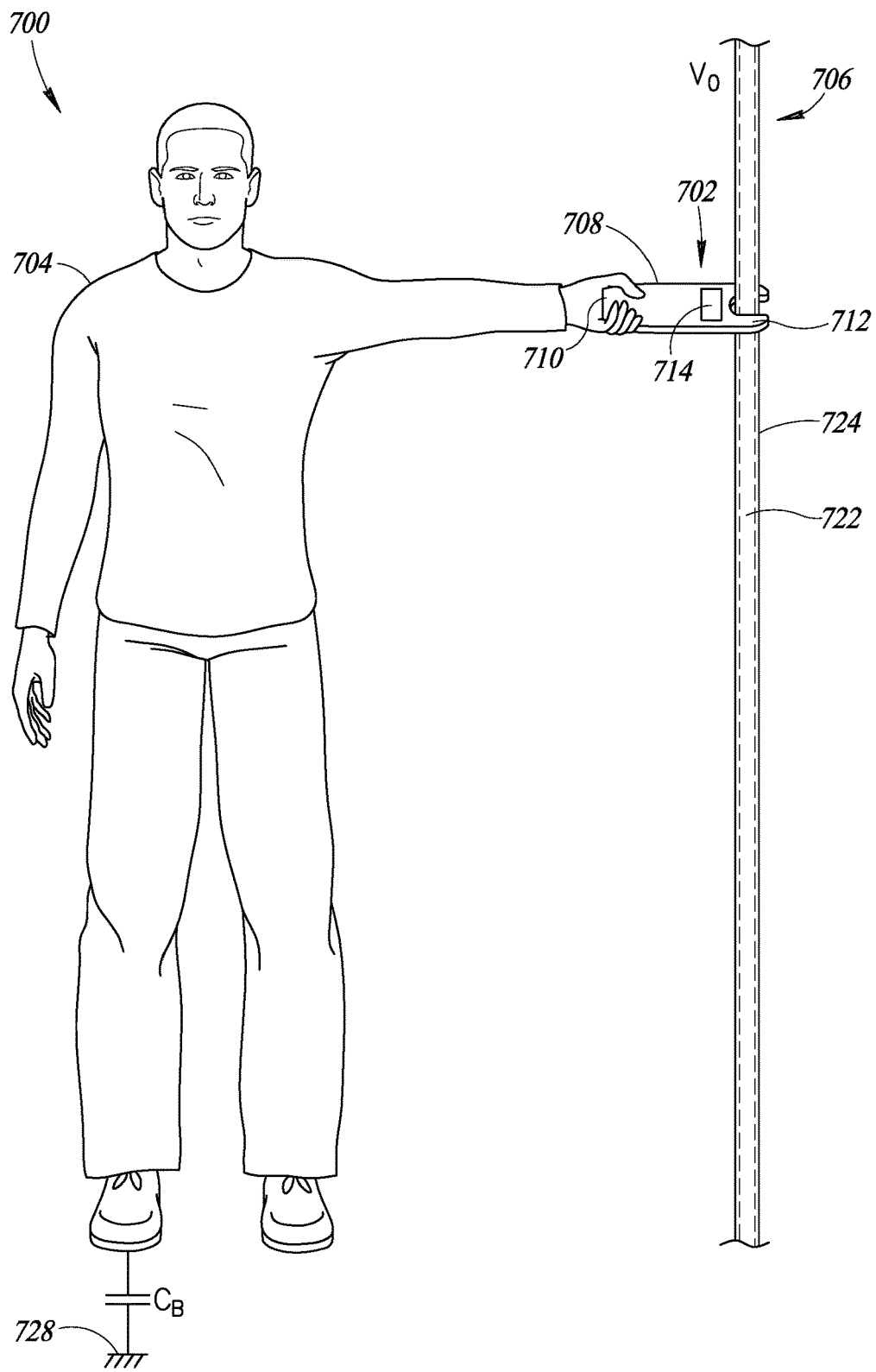
FIG. 7A is a pictorial diagram of an environment in which a non-contact multi-phase measurement device may be used, according to one illustrated implementation.
Figure 7B:
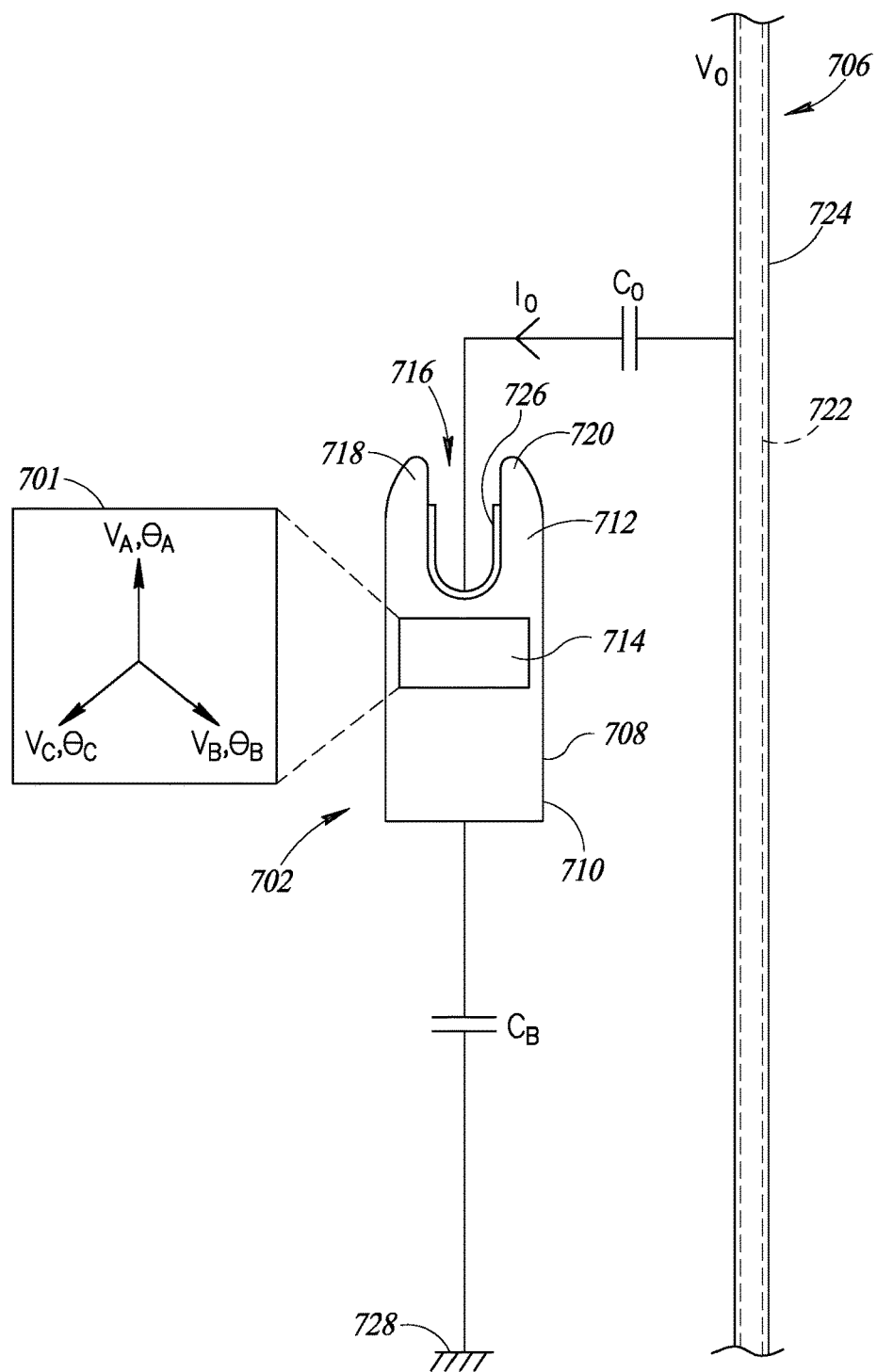
FIG. 7B is a top view of the non-contact multi-phase measurement device of FIG. 7A, showing a coupling capacitance formed between an insulated wire and a conductive sensor of the non-contact voltage measurement device, an insulated conductor current component, and a body capacitance between the non-contact multi-phase measurement device and an operator, according to one illustrated implementation.

FIG. 7A is a pictorial diagram of an environment 700 in which a non-contact measurement device 702 that includes a reference signal type voltage sensor or system may be used by an operator 704 to measure AC voltage present in an insulated wire 706 without requiring galvanic contact between the non-contact measurement device and the wire 706. The measurement device 702 may include some or all of the functionality of the measurement devices discussed above with reference to FIGS. 1-6. FIG. 7B is a top plan view of the non-contact measurement device 702 of FIG. 7A, showing various electrical characteristics of the non-contact measurement device during operation and an example display of a phasor diagram 701 for a three-phase electrical system. The non-contact measurement device 702 includes a housing or body 708 which includes a grip portion or end 710 and a probe portion or end 712, also referred to herein as a front end, opposite the grip portion. The housing 708 may also include a user interface 714 which facilitates user interaction with the non-contact measurement device 702. The user interface 714 may include any number of inputs (e.g., buttons, dials, switches, touch sensor) and any number of outputs (e.g., display, LEDs, speakers, buzzers). The non-contact measurement device 702 may also include one or more wired and/or wireless communications interfaces (e.g., USB, Wi-Fi®, Bluetooth®).

In at least some implementations, as shown best in FIG. 7B, the probe portion 712 may include a recessed portion 716 defined by first and second extended portions 718 and 720. The recessed portion 716 receives the insulated wire 706 (see FIG. 7A). The insulated wire 706 includes a conductor 722 and an insulator 724 surrounding the conductor 722. The recessed portion 716 may include a sensor or electrode 726 which rests proximate the insulator 724 of the insulated wire 706 when the insulated wire is positioned within the recessed portion 716 of the non-contact measurement device 702. Although not shown for clarity, the sensor 726 may be disposed inside of the housing 708 to prevent physical and electrical contact between the sensor and other objects. The measurement device 702 may also include a current sensor that is operative to measure current, as discussed above with reference to FIGS. 1-6.

As shown in FIG. 7A, in use the operator 704 may grasp the grip portion 710 of the housing 708 and place the probe portion 712 proximate the insulated wire 706 so that the non-contact measurement device 702 may accurately measure the AC voltage present in the wire with respect to earth ground (or another reference node). Although the probe end 712 is shown as having the recessed portion 716, in other implementations the probe portion 712 may be configured differently. For example, in at least some implementations the probe portion 712 may include a selectively movable clamp, a hook, a flat or arcuate surface which includes the sensor, or other type of interface which allows a sensor of the non-contact measurement device 702 to be positioned proximate the insulated wire 706.

The operator's body acting as a reference to earth/ground may only be used in some implementations. The non-contact measurement functionality discussed herein is not limited to applications only measuring against earth. The outside reference may be capacitively coupled to any other potential. For example, if the outside reference is capacitively coupled to another phase in a three phase system, the phase-to-phase voltages are measured. In general, the concepts discussed herein are not limited to reference against earth only using a body capacitive coupling connected to a reference voltage and any other reference potential.

As discussed further below, in at least some implementations, the non-contact measurement device 702 may utilize the body capacitance ($C_B$) between the operator 704 and ground 728 during the AC measurement. Although the term ground is used for the node 728, the node is not necessarily earth/ground but could be connected in a galvanically isolated manner to any other reference potential by capacitive coupling or also with direct galvanic connected coupling (e.g., via a test lead).

Figure 8:
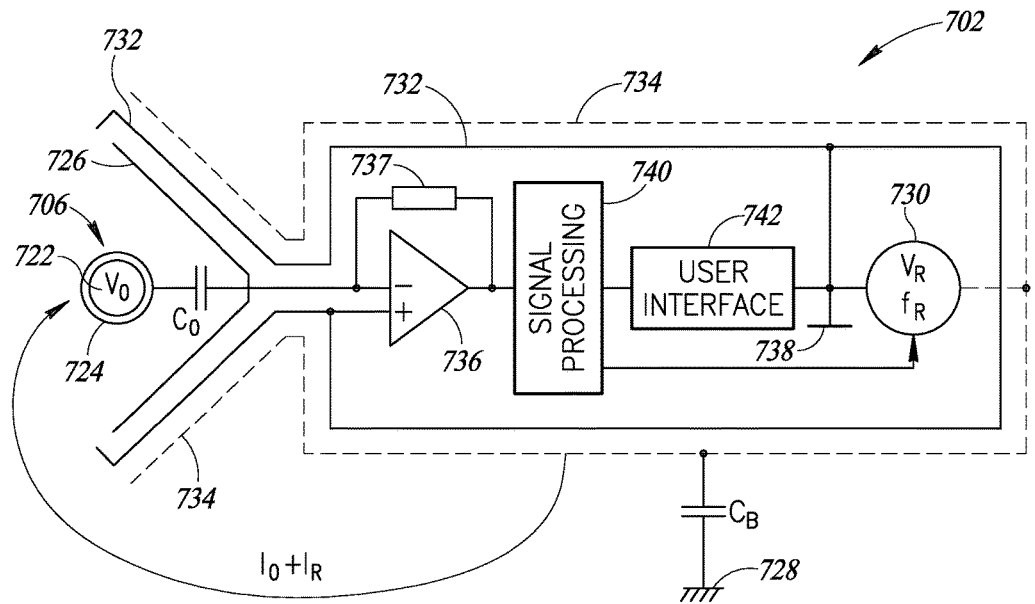
FIG. 8 is a schematic diagram of various internal components of a non-contact multi-phase measurement device, according to one illustrated implementation.

FIG. 8 shows a schematic diagram of various internal components of the non-contact measurement device 702 also shown in FIGS. 7A and 7B. In this example, the conductive sensor 726 of the non-contact measurement device 702 is substantially "V-shaped" and is positioned proximate the insulated wire 706 under test and capacitively couples with the conductor 722 of the insulated wire 706, forming a sensor coupling capacitor ($C_O$). The operator 704 handling the non-contact measurement device 702 has a body capacitance ($C_B$) to ground. Thus, as shown in FIGS. 7B and 8, the AC voltage signal ($V_O$) in the wire 722 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 722 to be measured has a connection to an external ground 728 (e.g., neutral). The non-contact measurement device 702 itself also has a capacitance to ground 728, which consists primarily of the body capacitance ($C_B$) when the operator 704 (FIG. 7A) holds the non-contact measurement device in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 726 and loops back to the external ground 728 through the housing 708 of the non-contact measurement device and the body capacitor ($C_B$) to ground 728. The current signal ($I_O$) is dependent on the distance between the conductive sensor 726 of the non-contact measurement device 702 and the insulated wire 706 under test, the particular shape of the conductive sensor 726, and the size and voltage level ($V_O$) in the conductor 722.

To compensate for the distance variance and consequent coupling capacitor ($C_O$) variance which directly influences the signal current ($I_O$), the non-contact measurement device 702 includes a common mode reference voltage source 730 which generates an AC reference voltage ($V_R$) which has a reference frequency ($f_R$) different from the signal voltage frequency (fo).

To reduce or avoid stray currents, at least a portion of the non-contact measurement device 702 may be surrounded by a conductive internal ground guard or screen 732 which causes most of the current to run through the conductive sensor 726 which forms the coupling capacitor ($C_O$) with the conductor 722 of the insulated wire 706. The internal ground guard 732 may be formed from any suitable conductive material (e.g., copper) and may be solid (e.g., foil) or have one or more openings (e.g., mesh).

Further, to avoid currents between the internal ground guard 732 and the external ground 728, the non-contact measurement device 702 includes a conductive reference shield 734. The reference shield 734 may be formed from any suitable conductive material (e.g., copper) and may be solid (e.g., foil) or have one or more openings (e.g., mesh). The common mode reference voltage source 730 is electrically coupled between the reference shield 734 and the internal ground guard 732, which creates a common mode voltage having the reference voltage ($V_R$) and the reference frequency ($f_R$) for the non-contact measurement device 702. Such AC reference voltage ($V_R$) drives an additional reference current ($I_R$) through the coupling capacitor ($C_O$) and the body capacitor ($C_B$).

The internal ground guard 732 which surrounds at least a portion of the conductive sensor 726 protects the conductive sensor against direct influence of the AC reference voltage ($V_R$) causing an unwanted offset of reference current ($I_R$) between the conductive sensor 726 and the reference shield 734. As noted above, the internal ground guard 732 is the internal electronic ground 738 for the non-contact measurement device 702. In at least some implementations, the internal ground guard 732 also surrounds some or all of the electronics of the non-contact measurement device 702 to avoid the AC reference voltage ($V_R$) coupling into the electronics.

As noted above, the reference shield 734 is utilized to inject a reference signal onto the input AC voltage signal ($V_O$) and as a second function minimizes the guard 732 to earth ground 728 capacitance. In at least some implementations, the reference shield 734 surrounds some or all of the housing 708 of the non-contact measurement device 702. In such implementations, some or all of the electronics see the reference common mode signal which also generates the reference current ($I_R$) between the conductive sensor 726 and the conductor 722 in the insulated wire 706. In at least some implementations, the only gap in the reference shield 734 may be an opening for the conductive sensor 726 which allows the conductive sensor to be positioned proximate the insulated wire 706 during operation of the non-contact measurement device 702.

The internal ground guard 732 and the reference shield 734 may provide a double layer screen around the housing 708 (see FIGS. 7A and 7B) of the non-contact measurement device 702. The reference shield 734 may be disposed on an outside surface of the housing 708 and the internal ground guard 732 may function as an internal shield or guard. The conductive sensor 726 is shielded by the guard 732 against the reference shield 734 such that any reference current flow is generated by the coupling capacitor ($C_O$) between the conductive sensor 726 and the conductor 722 under test.

The guard 732 around the sensor 726 also reduces stray influences of adjacent wires close to the sensor.

As shown in FIG. 8, the non-contact measurement device 702 may include an input amplifier 736 which operates as an inverting current-to-voltage converter. The input amplifier 736 has a non-inverting terminal electrically coupled to the internal ground guard 732 which functions as the internal ground 738 of the non-contact measurement device 702. An inverting terminal of the input amplifier 736 may be electrically coupled to the conductive sensor 726. Feedback circuitry 737 (e.g., feedback resistor) may also be coupled between the inverting terminal and the output terminal of the input amplifier 736 to provide feedback and appropriate gain for input signal conditioning.

The input amplifier 736 receives the signal current ($I_O$) and the reference current ($I_R$) from the conductive sensor 726 and converts the received currents into a sensor current voltage signal indicative of the conductive sensor current at the output terminal of the input amplifier. The sensor current voltage signal may be an analog voltage, for example. The analog voltage may be fed to a signal processing module 740 which, as discussed further below, processes the sensor current voltage signal to determine the AC voltage ($V_O$) in the conductor 722 of the insulated wire 706. The signal processing module 740 may include any combination of digital and/or analog circuitry.

The non-contact measurement device 702 may also include a user interface 742 (e.g., display) communicatively coupled to the signal processing module 740 to present the determined AC voltage ($V_O$) or to communicate by an interface to the operator 704 of the non-contact measurement device.

Figure 9:
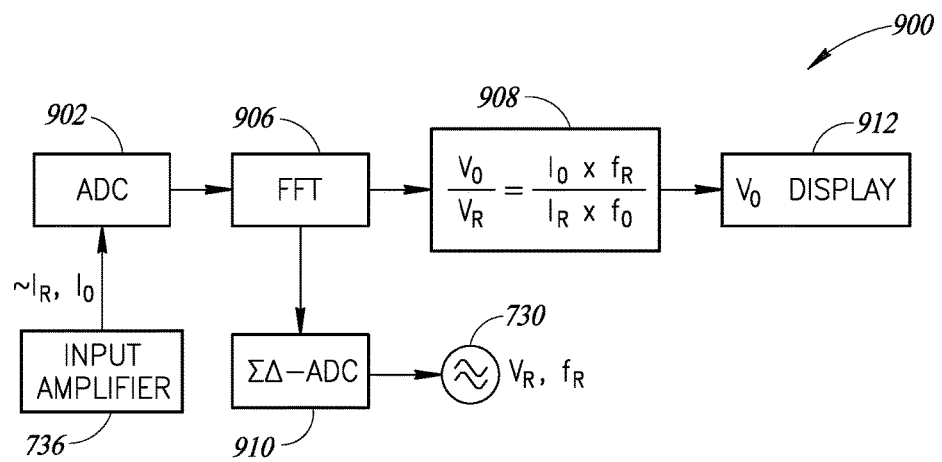
FIG. 9 is a block diagram which shows various signal processing components of a non-contact multi-phase measurement device, according to one illustrated implementation.

FIG. 9 is a block diagram of a non-contact measurement device 900 which shows various signal processing components of the non-contact measurement device. The non-contact measurement device 900 may be similar or identical to the measurement devices discussed above. Accordingly, similar or identical components are labeled with the same reference numerals. As shown, the input amplifier 736 converts the input current ($I_O + I_R$) from the conductive sensor 726 into a sensor current voltage signal which is indicative of the input current. The sensor current voltage signal is converted into digital form using an analog-to-digital converter (ADC) 902.

The AC voltage ($V_O$) in the wire 722 is related to the AC reference voltage ($V_R$) by Equation (1):

$$\frac{V_O}{V_R} = \frac{I_O \times f_R}{I_R \times f_O} \tag{1}$$

where ($I_O$) is the signal current through the conductive sensor 726 due to the AC voltage ($V_O$) in the conductor 722, ($I_R$) is the reference current through the conductive sensor 726 due to the AC reference voltage ($V_R$), ($f_O$) is the frequency of the AC voltage ($V_O$) that is being measured, and ($f_R$) is the frequency of the reference AC voltage ($V_R$).

The signals with indices "O," which are related to the AC voltage ($V_O$), have different characteristics like frequencies than the signals with indices "R," which are related to the common mode reference voltage source 730. Digital processing, such as circuitry implementing a Fast Fourier Transform (FFT) algorithm 906, may be used to separate signal magnitudes with different frequencies. Analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 722 under test needs either to be measured to determine the ratio of the reference frequency ($f_R$) to the signal frequency ($f_O$), which is utilized in Equation (1) listed above or the reference frequency is already known because it is generated by the system itself.

After the input current ($I_O+I_R$) has been conditioned by the input amplifier 736 and digitized by the ADC 902, the frequency components of the digital sensor current voltage signal may be determined by representing the signal in the frequency domain using the FFT 906. When both of the frequencies ($f_O$) and ($f_R$) have been measured, frequency bins may be determined to calculate the fundamental magnitudes of the currents ($I_O$) and ($I_R$) from the FFT 906.

The magnitude of the current ($I_R$) and/or the current ($I_O$) may vary as a function of distance between the reference signal sensor or electrode (e.g., electrode 726) and the conductor 722 of the insulated wire 706. As discussed above, such characteristic may be used during measurement of multi-phase electrical systems to detect whether the sensor is positioned proximate a conductor under test. The system may compare the measured current ($I_R$) and/or the current ($I_O$) to expected respective currents to determine the distance between the reference signal sensor or electrode and the conductor 722. Next, as indicated by a block 908, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 722, which is done by calculating the square root of the squared harmonics sum, and which may be presented to the user on a display 912.

The coupling capacitor ($C_O$) may generally have a capacitance value in the range of approximately 0.02 pF to 1 pF, for example, depending on the distance between the insulated conductor 706 and the conductive sensor 726, as well as the particular shape and dimensions of the sensor 726. The body capacitance ($C_B$) may have a capacitance value of approximately 20 pF to 200 pF, for example.

From Equation (1) above, it can be seen that the AC reference voltage ($V_R$) generated by the common mode reference voltage source 730 does not need to be in the same range as the AC voltage ($V_O$) in the conductor 722 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 722 to produce currents ($I_R$) and ($I_O$) which are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 9, a Sigma-Delta digital-to-analog converter (Σ-Δ DAC) 910 is used. The Σ-Δ DAC 910 uses a bit stream to create a waveform (e.g., sinusoidal waveform) signal with the defined reference frequency ($f_R$) and AC reference voltage ($V_R$). In at least some implementations, the Σ-Δ DAC 910 may generate a waveform that is in phase with the window of the FFT 906 to reduce jitter.

In at least some implementations, the ADC 902 may have 14 bits of resolution. In operation, the ADC 902 may sample the output from the input amplifier 736 at a sampling frequency of 10.24 kHz for nominal 50 Hz input signals to provide $2^n$ samples (1024) in 100 ms (10 Hz bins for the FFT 906) ready for processing by the FFT 906. For 60 Hz input signals, the sampling frequency may be 12.288 kHz, for example, to get the same number of samples per cycle. The sampling frequency of the ADC 902 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 906 and use a Hanning window function for further calculations to suppress phase shift jitter caused by incomplete signal cycles captured in the aggregation interval.

In one example, the common mode reference voltage source 730 generates an AC reference voltage ($V_R$) which has a reference frequency ($f_R$) of 2419 Hz. This frequency is in between the $40^{th}$ harmonic and the $41^{st}$ harmonic for 60 Hz signals, and between the $48^{th}$ harmonic and $49^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 730 is selected to be a frequency that is least likely to be affected by harmonics of an AC voltage ($V_O$) in the conductor 722 under test. As an example, the common mode reference voltage source 730 may be switched off when the reference current ($I_R$) exceeds a limit, which may indicate that the conductive sensor 726 is approaching the conductor 722 under test. A measurement (e.g., 100 ms measurement) may be taken with the common mode reference voltage source 730 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. For example, in at least some implementations the multi-phase measurement device may comprise a plurality (e.g., three) of contact or non-contact sensor subsystems that may each be positioned proximate a respective one of the conductors of a multi-phase electrical system simultaneously. The plurality of sensor subsystems may each include a voltage sensor and/or a current sensor, as discussed above. Further, each of the sensor subsystems may be coupled to the same processing circuitry which, during operation, switches between each sensor subsystem to obtain measurement data for each of the conductors of the multi-phase electrical system. In such implementations, the multi-phase measurement device would not need to direct the operator to position the same sensor proximate to each conductor.

To the extent that they are not inconsistent with the specific teachings and definitions herein, U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A multi-phase measurement device, comprising:
a sensor subsystem that, in operation, senses at least one of voltage or current in a conductor;
a user interface;
control circuitry communicatively coupled to the sensor subsystem, wherein in operation, the control circuitry:
  causes the user interface to direct a user of the multi-phase measurement device to position a sensor of the sensor subsystem proximate a first conductor of a multi-phase electrical system;
  receives, via the sensor subsystem, first conductor electrical parameter data associated with a signal present in the first conductor, the first conductor electrical parameter data comprising at least one of voltage data or current data;
  processes the received first conductor electrical parameter data to determine a frequency of the signal in the first conductor;
  establishes synchronization data based at least in part on the determined frequency of the signal in the first conductor;
  causes the user interface to direct the user to position a sensor of the sensor subsystem proximate a second conductor of the multi-phase electrical system;
  receives, via the sensor subsystem, second conductor electrical parameter data associated with a signal present in the second conductor, the second conductor electrical parameter data comprising at least one of voltage data or current data;
  processes the received second conductor electrical parameter data to determine phase information for the signal in the second conductor relative to phase information for the signal in the first conductor based at least in part on the established synchronization data;
  causes the user interface to direct the user to position a sensor of the sensor subsystem proximate a third conductor of the multi-phase electrical system;
  receives, via the sensor subsystem, third conductor electrical parameter data associated with a signal present in the third conductor, the third conductor electrical parameter data comprising at least one of voltage data or current data; and
  processes the received third conductor electrical parameter data to determine phase information for the signal in the third conductor relative to phase information for the signal in at least one of the first conductor or the second conductor based at least in part on the established synchronization data,
  wherein prior to the reception of each of the first conductor electrical parameter data, second conductor electrical parameter data, and third conductor electrical parameter data, the control circuitry receives measurement data from the sensor subsystem indicative of whether the sensor of the sensor subsystem is positioned proximate the first conductor, second conductor, and third conductor, respectively, and wherein the sensor subsystem generates a reference current, and the measurement data comprises a characteristic of the reference current detected in the first conductor, second conductor, or third conductor.

2. The multi-phase measurement device of claim 1 wherein the synchronization data comprises a fixed repeating interval that has a duration that is equal to a period of the signal in the first conductor.

3. The multi-phase measurement device of claim 1 wherein the sensor subsystem comprises at least a current sensor and a voltage sensor.

4. The multi-phase measurement device of claim 1 wherein the sensor subsystem comprises at least one of a non-contact voltage sensor or a non-contact current sensor.

5. The multi-phase measurement device of claim 1 wherein, in operation, the control circuitry:
processes the first conductor electrical parameter data, second conductor electrical parameter data, and third conductor electrical parameter data to determine at least one additional electrical parameter of the multi-phase electrical system.

6. The multi-phase measurement device of claim 5 wherein the at least one additional electrical parameter comprises at least one of a voltage parameter, a current parameter, a power parameter, a phase sequence parameter, a voltage phase shift parameter, a current phase shift parameter, a voltage/current phase shift parameter, a harmonics parameter, or a waveform parameter.

7. The multi-phase measurement device of claim 1 wherein, in operation, the control circuitry:
causes the user interface to present an indication of the determined phase information on a display of the user interface.

8. The multi-phase measurement device of claim 7 wherein the indication of the determined phase information comprises a phasor diagram presented on the display of the user interface.

9. The multi-phase measurement device of claim 1 wherein, in operation, the control circuitry processes the received first conductor electrical parameter data utilizing a Fast Fourier Transform (FFT) to determine a frequency of the signal in the first conductor.

10. A multi-phase measurement device, comprising:
a sensor subsystem that, in operation, senses at least one of voltage or current in a conductor;
a user interface;
control circuitry communicatively coupled to the sensor subsystem, wherein in operation, the control circuitry:
causes the user interface to direct a user of the multi-phase measurement device to position a sensor of the sensor subsystem proximate a first conductor of a multi-phase electrical system;
receives, via the sensor subsystem, first conductor electrical parameter data associated with a signal present in the first conductor, the first conductor electrical parameter data comprising at least one of voltage data or current data:
processes the received first conductor electrical parameter data to determine a frequency of the signal in the first conductor;
establishes synchronization data based at least in part on the determined frequency of the signal in the first conductor;
causes the user interface to direct the user to position a sensor of the sensor subsystem proximate a second conductor of the multi-phase electrical system;
receives, via the sensor subsystem, second conductor electrical parameter data associated with a signal present in the second conductor, the second conductor electrical parameter data comprising at least one of voltage data or current data:
processes the received second conductor electrical parameter data to determine phase information for the signal in the second conductor relative to phase information for the signal in the first conductor based at least in part on the established synchronization data;
causes the user interface to direct the user to position a sensor of the sensor subsystem proximate a third conductor of the multi-phase electrical system;
receives, via the sensor subsystem, third conductor electrical parameter data associated with a signal present in the third conductor, the third conductor electrical parameter data comprising at least one of voltage data or current data: and
processes the received third conductor electrical parameter data to determine phase information for the signal in the third conductor relative to phase information for the signal in at least one of the first conductor or the second conductor based at least in part on the established synchronization data,
wherein prior to the reception of each of the first conductor electrical parameter data, second conductor electrical parameter data, and third conductor electrical parameter data, the control circuitry receives measurement data from the sensor subsystem indicative of whether the sensor of the sensor subsystem is positioned proximate the first conductor, second conductor, and third conductor, respectively, and wherein, responsive to receipt of measurement data indicative that the sensor of the sensor subsystem is not positioned proximate one of the first conductor, second conductor, or third conductor after a time period, the control circuitry causes the user interface to direct the user to restart measurement of the multi-phase electrical system.

11. A multi-phase measurement device, comprising:
a sensor subsystem that, in operation, senses at least one of voltage or current in a conductor;
a user interface;
control circuitry communicatively coupled to the sensor subsystem, wherein in operation, the control circuitry:
causes the user interface to direct a user of the multi-phase measurement device to position a sensor of the sensor subsystem proximate a first conductor of a multi-phase electrical system;
receives, via the sensor subsystem, first conductor electrical parameter data associated with a signal present in the first conductor, the first conductor electrical parameter data comprising at least one of voltage data or current data:
processes the received first conductor electrical parameter data to determine a frequency of the signal in the first conductor;
establishes synchronization data based at least in part on the determined frequency of the signal in the first conductor;
causes the user interface to direct the user to position a sensor of the sensor subsystem proximate a second conductor of the multi-phase electrical system;
receives, via the sensor subsystem, second conductor electrical parameter data associated with a signal present in the second conductor, the second conductor electrical parameter data comprising at least one of voltage data or current data:
processes the received second conductor electrical parameter data to determine phase information for the signal in the second conductor relative to phase information for the signal in the first conductor based at least in part on the established synchronization data;

causes the user interface to direct the user to position a sensor of the sensor subsystem proximate a third conductor of the multi-phase electrical system;

receives, via the sensor subsystem, third conductor electrical parameter data associated with a signal present in the third conductor, the third conductor electrical parameter data comprising at least one of voltage data or current data: and processes the received third conductor electrical parameter data to determine phase information for the signal in the third conductor relative to phase information for the signal in at least one of the first conductor or the second conductor based at least in part on the established synchronization data, wherein a time period between when the control circuitry causes the user interface to direct the user to position the sensor of the sensor subsystem proximate the first conductor and when the control circuitry receives third conductor electrical parameter data associated with the signal present in the third conductor is constrained to be less than 30 seconds.

12. A multi-phase measurement device, comprising:
a sensor subsystem that, in operation, senses at least one of voltage or current in a conductor;
a user interface;
control circuitry communicatively coupled to the sensor subsystem, wherein in operation, the control circuitry:
  causes the user interface to direct a user of the multi-phase measurement device to position a sensor of the sensor subsystem proximate a first conductor of a multi-phase electrical system;
  receives, via the sensor subsystem, first conductor electrical parameter data associated with a signal present in the first conductor, the first conductor electrical parameter data comprising at least one of voltage data or current data;
  processes the received first conductor electrical parameter data to determine a frequency of the signal in the first conductor;
  establishes synchronization data based at least in part on the determined frequency of the signal in the first conductor;
  causes the user interface to direct the user to position a sensor of the sensor subsystem proximate a second conductor of the multi-phase electrical system;
  receives, via the sensor subsystem, second conductor electrical parameter data associated with a signal present in the second conductor, the second conductor electrical parameter data comprising at least one of voltage data or current data; and
  processes the received second conductor electrical parameter data to determine phase information for the signal in the second conductor relative to phase information for the signal in the first conductor based at least in part on the established synchronization data
wherein prior to the reception of each of the first conductor electrical parameter data, second conductor electrical parameter data, and third conductor electrical parameter data, the control circuitry receives measurement data from the sensor subsystem indicative of whether the sensor of the sensor subsystem is positioned proximate the first conductor, second conductor, and third conductor, respectively, and wherein, responsive to receipt of measurement data indicative that the sensor of the sensor subsystem is not positioned proximate one of the first conductor, second conductor, or third conductor after a time period, the control circuitry causes the user interface to direct the user to restart measurement of the multi-phase electrical system.

13. A method of operating a multi-phase measurement device, the method comprising:
  causing, by control circuitry, a user interface to direct a user to position a sensor of a sensor subsystem proximate a first conductor of a multi-phase electrical system;
  receiving, by the control circuitry via the sensor subsystem, first conductor electrical parameter data associated with a signal present in the first conductor, the first conductor electrical parameter data comprising at least one of voltage data or current data;
  processing, by the control circuitry, the received first conductor electrical parameter data to determine a frequency of the signal in the first conductor;
  establishing, by the control circuitry, synchronization data based at least in part on the determined frequency of the signal in the first conductor;
  causing, by the control circuitry, the user interface to direct the user to position a sensor of the sensor subsystem proximate a second conductor of the multi-phase electrical system;
  receiving, by the control circuitry via the sensor subsystem, second conductor electrical parameter data associated with a signal present in the second conductor, the second conductor electrical parameter data comprising at least one of voltage data or current data;
  processing, by the control circuitry, the received second conductor electrical parameter data to determine phase information for the signal in the second conductor relative to phase information for the signal in the first conductor based at least in part on the established synchronization data;
  causing, by the control circuitry, the user interface to direct the user to position a sensor of the sensor subsystem proximate a third conductor of the multi-phase electrical system;
  receiving, by the control circuitry via the sensor subsystem, third conductor electrical parameter data associated with a signal present in the third conductor, the third conductor electrical parameter data comprising at least one of voltage data or current data;
  processing, by the control circuitry, the received third conductor electrical parameter data to determine phase information for the signal in the third conductor relative to phase information for the signal in at least one of the first conductor or the second conductor based at least in part on the established synchronization data;
  prior to receiving each of the first conductor electrical parameter data, second conductor electrical parameter data, and third conductor electrical parameter data, receiving, by the control circuitry, measurement data from the sensor subsystem indicative of whether the sensor of the sensor subsystem is positioned proximate the first conductor, second conductor, and third conductor, respectively; and
  responsive to receiving measurement data indicative that the sensor of the sensor subsystem is not positioned proximate one of the first conductor, second conductor, or third conductor after a time period, causing, by the control circuitry, the user interface to direct the user to restart measurement of the multi-phase electrical system.

14. The method of claim 13, further comprising processing, by the control circuitry, the first conductor electrical parameter data, second conductor electrical parameter data, and third conductor electrical parameter data to determine at least one additional electrical parameter of the multi-phase electrical system.

15. The method of claim 13, further comprising processing, by the control circuitry, the first conductor electrical parameter data, second conductor electrical parameter data, and third conductor electrical parameter data to determine at least one of a voltage parameter, a current parameter, a power parameter, a phase sequence parameter, a voltage phase shift parameter, a current phase shift parameter, a voltage/current phase shift parameter, a harmonics parameter, or a waveform parameter.

16. The method of claim 13, further comprising causing, by the control circuitry, the user interface to present an indication of the determined phase information on a display of the user interface.

17. The method of claim 13 wherein processing the received first conductor electrical parameter data, second conductor electrical parameter data, and third conductor electrical parameter data comprises processing the received first conductor electrical parameter data, second conductor electrical parameter data, and third conductor electrical parameter data utilizing a Fast Fourier Transform (FFT).

* * * * *